(12) United States Patent
Pickerd

(10) Patent No.: US 11,449,697 B2
(45) Date of Patent: Sep. 20, 2022

(54) COMBINED HIGHER ORDER STATISTICS AND ARTIFICIAL INTELLIGENCE SIGNAL ANALYSIS

(71) Applicant: Tektronix, Inc., Beaverton, OR (US)

(72) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 85 days.

(21) Appl. No.: 17/018,198

(22) Filed: Sep. 11, 2020

(65) Prior Publication Data

US 2021/0081630 A1    Mar. 18, 2021

Related U.S. Application Data

(60) Provisional application No. 62/900,422, filed on Sep. 13, 2019.

(51) Int. Cl.
| | |
|---|---|
| *G06K 7/14* | (2006.01) |
| *G06K 9/62* | (2022.01) |
| *H03M 1/66* | (2006.01) |
| *G06N 3/02* | (2006.01) |

(52) U.S. Cl.
CPC .......... *G06K 7/1413* (2013.01); *G06K 9/627* (2013.01); *G06N 3/02* (2013.01); *H03M 1/66* (2013.01)

(58) Field of Classification Search
CPC .. G06K 7/1413; G06K 7/10881; G06K 9/627; G06Q 20/32

USPC .................. 235/472.02, 472.01, 462.45, 375
See application file for complete search history.

(56) References Cited

U.S. PATENT DOCUMENTS

| | | | |
|---|---|---|---|
| 2005/0031029 A1* | 2/2005 | Yamaguchi ...... | G01R 31/31709 375/226 |
| 2010/0048142 A1* | 2/2010 | Hou .................. | G01R 31/31725 455/67.13 |
| 2016/0323094 A1* | 11/2016 | Tan ....................... | H04L 7/0008 |

FOREIGN PATENT DOCUMENTS

WO    WO-2019118060 A1 *   6/2019   ......... A61B 5/0075

* cited by examiner

*Primary Examiner* — Edwyn Labaze
(74) *Attorney, Agent, or Firm* — Miller Nash LLP; Andrew J. Harrington

(57) ABSTRACT

A test and measurement instrument for analyzing signals using machine learning. The test and measurement instrument can determine a recovered clock signal based on the digital signal, set window positions for a fast Fourier transform of the digital signal, window the digital signal into a series of windowed waveform data based on the window positions, transform each of the windowed waveform data into a frequency-domain windowed waveform data using a fast Fourier transform, and determine high-order spectrum data of each of the frequency-domain windowed waveform data. The test and measurement instrument includes a neural network configured to receive the high-order spectrum data of the frequency-domain windowed transform data and classify each windowed waveform data based on the high-order spectrum data.

17 Claims, 7 Drawing Sheets

COMBINED HIGHER ORDER STATISTICS AND ARTIFICIAL INTELLIGENCE SIGNAL ANALYSIS

PRIORITY

This disclosure claims benefit of U.S. Provisional Application No. 62/900,422, titled "COMBINED BICOHERENCE AND ARTIFICIAL INTELLIGENCE SIGNAL ANALYSIS," filed on Sep. 13, 2019, which is incorporated herein by reference in its entirety.

FIELD OF THE INVENTION

This disclosure is directed to systems and methods related to test and measurement systems, and in particular, to test and measurement systems for signal analysis.

BACKGROUND

Jitter is a well-known term of art used to define the deviation from an ideal timing of an event in a signal. Jitter results in the mispositioning of the significant edges in a sequence of data bits from their ideal positions. This jitter may result from errors in recovered clock edge positions, or it may be caused from system reflections, or from system inter-symbol interference, resulting from a system transfer function. Other effects such as distortion may occur. In addition, there are other waveform measurements of interest that aid in characterizing channel data recovery accuracy and performance. In modern serial data communications systems, the serial data clock is not usually transmitted with the data, so jitter could cause data errors at the receiving end. It is therefore extremely important to characterize and classify various measurements of waveform parameters and system characteristics.

Test and measurement instruments are continually being improved to more accurately and more quickly identify and measure jitter from the signal under test.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
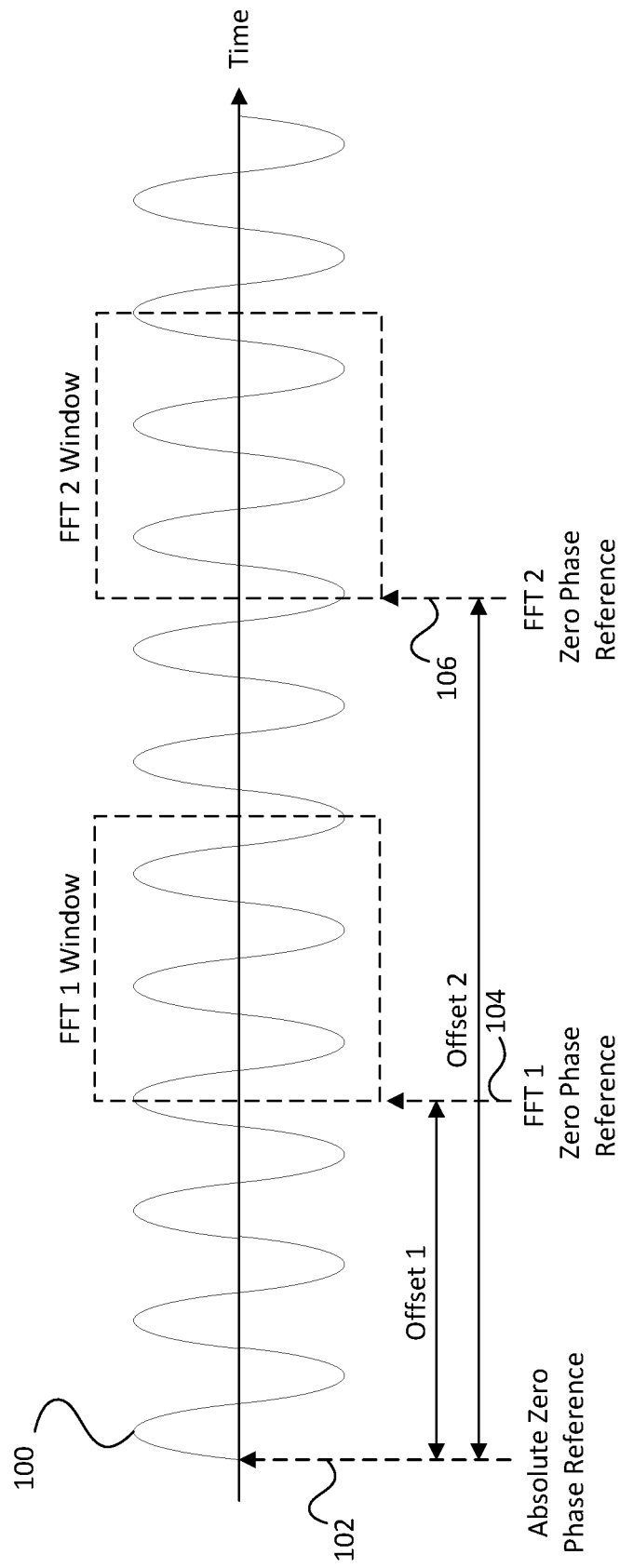
FIG. 1 is an example graph of absolute phase reference positions for bispectrum computation.

Disclosed herein are examples of test and measurement systems that can analyze a signal by applying clock recovery associated with synchronization to bicoherence based on computations, such as short term fast Fourier transform (FFT) computations, to analyze an input signal, such as a pseudorandom binary sequence (PRBS) signal. Bicoherence is utilized by examples of the disclosure to identify jitter and separate the jitter from the signal including other distortions such as inter-symbol interference (ISI), clock edge jitter, and other distortions of the signal. A vector space of the bicoherence result can be fed to a neural network that can be trained to recognize and classify various characteristics of the signal.

To understand bicoherence, definitions of first and second order cumulants are provided. A first order cumulant of a stationary process is the mean. The first order cumulant can be written with the notation in equation (1), where E is the expected value, which is the average of the signal:

$$C_{1x} = E\{x(t)\} \quad (1)$$

For higher order cumulants, the mean is normally subtracted.

The second order cumulant in the time domain is the auto-correlation function, and is written as shown in equation (2), where the overbar represents the complex conjugate:

$$C_{2x}(k) = E\{\overline{x(n)} \cdot x(n+k)\} \quad (2)$$

Auto-correlation, as shown in equation (2), is similar to a filter convolution. A filter convolution reverses the filter coefficients order in time prior to doing the multiply, accumulate, and shift. For auto-correlation, the order of the x(n) and x(n+k), with K shift, is not reversed. When the second order cumulant is transformed to the frequency domain, it is called the auto power spectrum and is represented by equation (3). The multiplication of x by its complex conjugate results in the phase of zero. The squared x(n) term is representative of power. Therefore, the power spectrum is representative of the second order cumulant in the frequency domain and can be written as shown in equation (3):

$$S_{2x}(f) = \sum_{k=-\infty}^{\infty} C_{2x}(k) \cdot e^{-j \cdot 2 \cdot \pi \cdot f \cdot k} \quad (3)$$

An alternative notation of equation (3) is shown in equation (4), where X is the spectrum of x:

$$S_{2x}(f) = X(f) \cdot \overline{X(f)} \quad (4)$$

The third order cumulant transformed into a three-dimensional space is referred to as the bispectrum. The third order cumulant in the time domain is shown in equation (5):

$$C_{3x}(k,l) = E\{\overline{x(n)} \cdot x(n+k) \cdot x(n+l)\} \quad (5)$$

The bispectrum is defined as the Fourier transform of the third order cumulant as shown in equation (6):

$$S_{3x}(f) = \sum_{k=-\infty}^{\infty} \sum_{l=-\infty}^{\infty} C_{3x}(k,l) \cdot e^{-j \cdot 2 \cdot \pi \cdot f1 \cdot k} \cdot e^{-j \cdot 2 \cdot \pi \cdot f2 \cdot l} \quad (6)$$

The bispectrum with alternative notation in the frequency domain is shown in equation (7) as the triple product:

$$B(f1,f2) = X(f1) \cdot X(f2) \cdot \overline{X(f1+f2)} \quad (7)$$

Variable B is the bispectrum at frequencies f1 and f2, and X(f) is the Fourier transform of the signal x(t). The overbar denotes the complex conjugate. Using the rules of complex multiplication, the magnitude of the bispectrum is equal to the product of the magnitudes of the function X at each frequency. The phase of the bispectrum is the sum of the phases of X at each frequency. The bispectrum depends on the magnitudes of X at each frequency.

If X is a continuous time invariant signal, and if X(f1), X(f2), and X(f1+f2) are perfectly phased locked, then if the short term FFT was calculated at several random points in time in the times of x(t), the bispectrum will always have the same value. If added together, the bispectrum for each point will sum without canceling. The phase from each short time FFT is adjusted with respect to an absolute reference time point on the waveform.

However, if X is a time variant signal, that is, if the phase at each frequency is random in time, and the magnitudes are constant, then there will tend to be cancelation when each bispectrum is added together. The result will tend toward zero depending on the relationships of phases and magnitudes of the time variant signal. Therefore, for time variant signals, such as a pseudorandom binary sequence signal, clock recovery is performed so that the phase of the signal does not average to zero.

Bicoherence normalizes the bispectrum to remove the magnitude dependence, as shown in equation (8):

$$b(f1, f2) = \frac{\left|\sum_n X_n(f1) \cdot X_n(f2) \cdot \overline{X_n(f1+f2)}\right|}{\sum_n |X_n(f1) \cdot X_n(f2) \cdot \overline{X_n(f1+f2)}|} \quad (8)$$

Where n is the index for each FFT frame and ranges from one to the number of FFT frames within a waveform record. The numerator of equation (8) contains the magnitude of the spectrum. If phase coupling is high, the magnitude value gets larger, but if the coupling is low, it approaches zero. In the denominator of equation (8), the summation is for magnitude only, essentially setting phase to all zero, thus normalizing the bispectrum to obtain bicoherence, b, which has a maximum value of one and a minimum value of zero.

When two sine waves of different frequencies are summed together and pass through a non-linear element, a multiplication process occurs. The resulting output consists of two sine waves at frequencies that are the sum of the two frequencies, and the difference of the two frequencies, as shown in equation (9):

$$\sin(a) \cdot \sin(b) = \frac{\cos(a-b) - \cos(a+b)}{2} \quad (9)$$

Therefore, in the bispectrum equation shown in equation (7) above, X(f1) and X(f2) may be two sine waves in phase and X(f1+f2) may be a distortion component after passing through a non-linear device. The bispectrum is commonly used for analysis of non-linear distortion components.

When X is a time invariant signal consisting of coherent frequencies, the bispectrum may be computed by taking multiple short time FFTs along the time record of x(t), then the bispectrum from each FFT is summed. The zero-phase reference point of an FFT is normally defined as a time position of the first sample in the time window of the FFT. As the FFT window moves along the time record, the phase of X(f1) and X(f2) rotate as a function of time position. Thus, the bispectrum from an FFT based on that phase reference would cause the bispectrum sum from all FFT positions to approach toward zero.

As such, an absolute phase reference position on the x(t) waveform is needed. Then, the phase of each FFT results can be adjusted with respect to the absolute time position, such as shown in FIG. 1. In FIG. 1, the phase of the sine wave 100 is 90 degrees with respect to the absolute zero phase reference point 102. However, the phase computation from FFT 1 would be 0.0 degrees and the phase computed from FFT 2 would be 180 degrees. Therefore, the phase values from FFT 1 are corrected according to offset 1, so that the FFT 1 has a zero phase reference 104. The phase values for FFT 2 are corrected according to offset 2, so that the FFT 2 has a zero phase reference 106. This allows FFT 1 and FFT 2 to return 90 degrees phase for signal with respect to the absolute zero phase time position 102. This allows the bispectrum values to be more accurately computed by averaging multiple time windows.

A pseudorandom binary sequence (PRBS) signal has a pseudo random bit pattern of length determined by the order of the polynomial used for generating the PRBS signal. The signal is therefore not time invariant and the bispectrum would tend towards zero.

Figure 2:
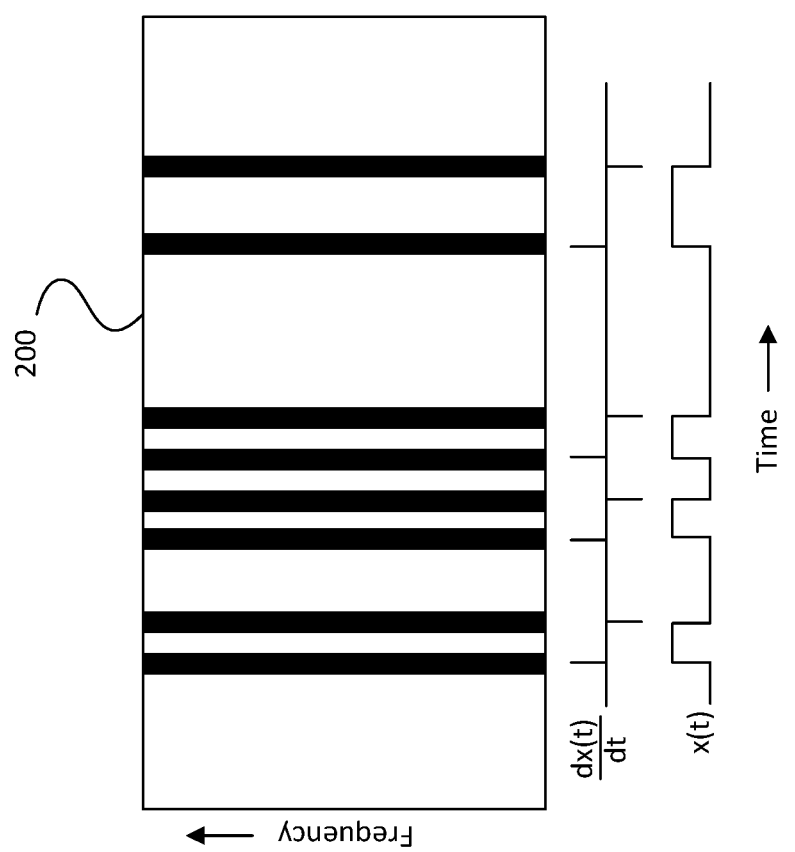
FIG. 2 is a bandwidth diagram that illustrates a time versus frequency plot for an ideal pseudorandom binary sequence signal.

Consider that the ideal PRBS signal consists of a series of ideal steps positioned at multiples of the unit interval (UI). A time versus frequency plot 200 for the derivative of x(t) with respect to time, t, is shown in FIG. 2. Since this is an idealized spectrogram, the frequency content for each pulse is the same. FIG. 2 illustrates an idealized spectrogram that cannot be computed in reality from a short term FFT because of the tradeoffs in resolution between time versus frequency, but FIG. 2 is shown for explanation. For example, to obtain only one impulse in an FFT window, it would have a very short record length less than one bit-interval. That record length would have a time window width that is not long enough to accurately measure the low frequency content of the signal. Over sampling would be desirable to obtain more resolution for determining jitter and ISI effects.

As the FFT window is made wider, the FFT window starts to include two or more bit-intervals of the signal. For the ideal impulse at each time position, shown in FIG. 2, where a bit transition occurs, the spectrum has a magnitude of 1 at every frequency, and the phase of every frequency is equal to zero with respect to the time position of the impulse for each individual transition.

A wider FFT window, however, will include a set of frequencies from each impulse inside the window that vary in phase by the delay between edges. These are summed together inside the FFT computation to provide a single combined phase at each frequency. If only two impulses are inside the FFT window, then one will by definition be a rising edge and the other must be a falling edge if it is a non-return-to-zero (NRZ) signal. A four-level pulse amplitude modulation (PAM4) signal may have two successive rising edges or two successive falling edges, or one falling and one rising. The phase of the rising is 180 degrees off from the phase of the falling for the ideal edges.

If multiple edges are in one window, then the phase, jitter, ISI, etc. of each edge will be summed together. If the pattern and position of edges are different from one window to the next, then the bispectrum sum will be averaged over a wider range of differences resulting in a smaller bicoherence value.

Present oscilloscope sampling rates are approximately 200 gigasamples per second (GS/s) to acquire a 53 Gigabaud (GBd) PAM4 signal with symbol width of 1/26.5 gigahertz (GHz) for a period of 37.7 picoseconds (ps). The period of the sample rate is 5 ps, which results in 7.547 samples per bit interval. An FFT including four symbol periods would be approximately 32 points in length.

When an impulse response of a channel for a PRBS signal in a test and measurement instrument is convolved with an ideal bit pattern, the edges of past bits affect the following bits. This is referred to as inter-symbol interference or ISI. ISI results in non-uniform rise and fall times that depend on the previous bit pattern. ISI will have an effect on the phase and magnitude of the spectrum from the derivative of each edge. This results in jitter of the edge that is often categorized as data dependent jitter (DDJ). Transmitter clock jitter from a device under test can cause the vertical bars in the spectrogram of FIG. 2 to become wider.

Figure 3:
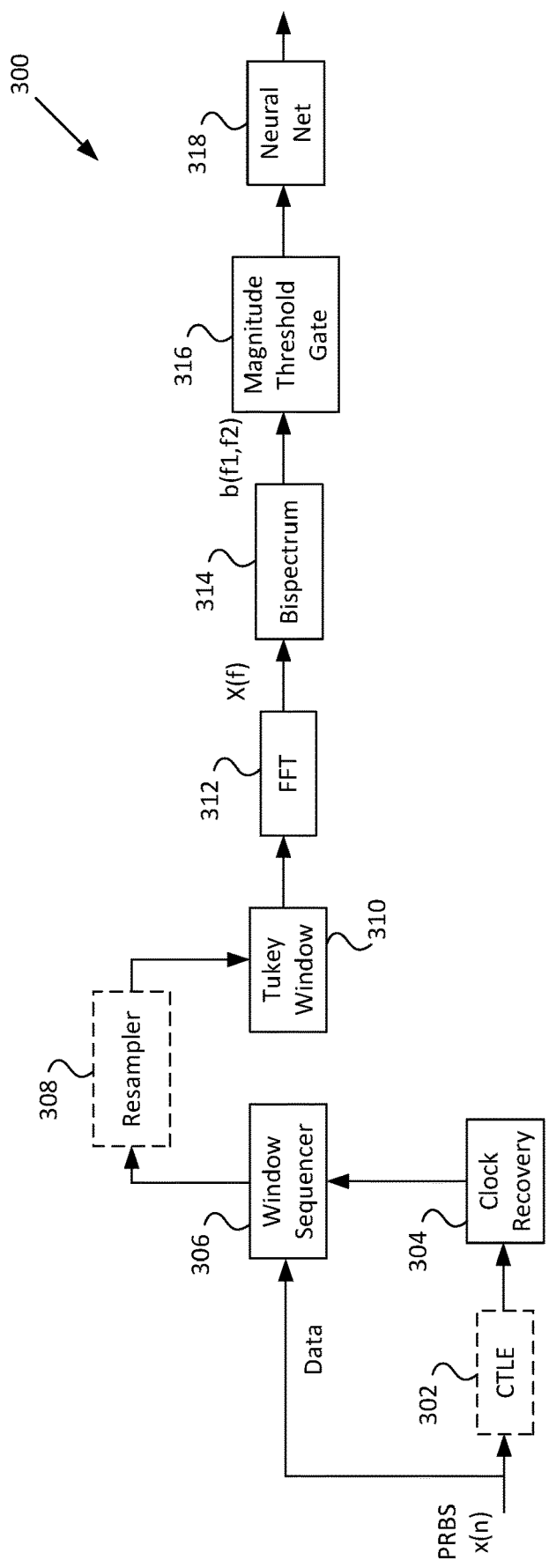
FIG. 3 is a block diagram of an example test and measurement system according to some configurations of the disclosure.

FIG. 3 illustrates an example test and measurement system 300 according to some examples of the disclosure. A signal, x(n), is received at an input of a test and measurement instrument. An optional continuous time linear equalizer (CTLE) 302 may be provided to perform partial de-embedding of test equipment and/or serial data link. Another optional filter, not shown, that may also be provided is a de-embed/embed filter for de-embedding test equipment and/or channel responses. The de-embed/embed filter would be located next to the CTLE 302, either before or after the CTLE 302.

Clock recovery 304 is performed by one or more processors. The clock recovery 304 receives either the input signal directly or the equalized input waveform from the CTLE 302 to produce a recovered clock waveform and/or a list of edge crossings. In some examples, an explicit clock that is acquired through an analog-to-digital converter can be used, or a bursty explicit clock as is obtained in a double data rate (DDR) memory system can be used.

The input signal and the recovered clock are sent to a window sequencer 306. In some alternative embodiments, rather than sending the input signal to the window sequencer 306, the equalized signal from the CTLE 302 may be sent. The window sequencer 306, which is performed by the one or more processors, keeps track of any short term FFT window positions with respect to the recovered clock signal and the input waveform data. As will be discussed further below, the window sequencer 306 allows the bispectrum or bicoherence function to be used in a meaningful way to extract waveform characteristics.

An optional resampler 308 can be provided in some examples. The resampler 308 resamples the signal in the FFT window interval so that a start of the FFT is at the center of a unit interval (UI). For situations where the input signal is a PRBS sequence, the resampler 308 removes the effect of the sample rate being asynchronous with respect to the start time of the window. Thus the resampler 308 removes analog-to-digital sample jitter. In other words, after resampling there will always be a data sample exactly at the start position of the window. For situations where the input signal is continuous, the resampler 308 may be used to insure the phase of the spectrum is with respect to an absolute time reference point on the waveform.

A window function 310, such as a Tukey window as shown in FIG. 3, is applied by the one or more processors prior to performing FFT 312 to convert the signal to the frequency domain. The window function 310 can isolate a portion of the signal for the FFT 312 to be performed on. The FFT 312 is performed by the one or more processors and is a short term FFT applied to the windowed waveform data at each time position determined by the window sequencer 306.

The phase reference point of the FFT 312 is used when computing the high-order spectrum data 314 for the signal. The recovered clock from clock recovery 304 is used to position the phase reference point for each FFT. Using the position of the phase reference point based on the recovered clock allows the edges in the FFT windows to be coherent with respect to the clock phase reference position.

High-order spectrum data 314 is determined by the one or more processors by taking in the spectrum from the FFT 312 and transforming the data into a bispectrum. The high-order spectrum data 314 may include the bispectrum as a complex value, a phase of the bispectrum, and/or a bicoherence. To determine bicoherence, the bispectrum is normalized to determine a magnitude value. That is, the bispectrum data 314 can be represented in at least one of the following before feeding the high-order spectrum data 314 to subsequent operations: a magnitude value, a phase value, and/or a complex value. Throughout this disclosure, high-order spectrum data 314 may include the bispectrum, the bicoherence, and/or a phase of the bispectrum. High-order spectrum data 314 may also include higher order statistics, such as fourth order or higher, that can be determined based on the spectrum.

A threshold gate 316 can be provided in some examples to keep bispectrum samples that have a magnitude value above a specified threshold level. The threshold level may be a magnitude threshold, phase threshold, and/or complex threshold. The threshold level may be set by a user or may be determined by the one or more processors. Although not shown, the test and measurement instrument may include a user interface to receive the user specified threshold level.

If the threshold gate 316 is a magnitude threshold gate 316, as shown in FIG. 3, the magnitude threshold gate 316 would pass a bispectrum if the magnitude is greater than or equal to the threshold, and set the bispectrum to zero or some other low level when the magnitude is below the threshold. Alternatively, the bispectrum phase may be gated based on the bicoherence magnitude threshold or the bispectrum phase. In some examples, the bispectrum may be left as a complex value and a complex threshold may be used.

The output of the threshold gate 316 is sent to a neural network 318. The neural network 318 receives the bispectrum and/or bicoherence in at least one of the forms of magnitude, phase, and/or complex. Through the neural network 318, machine learning is applied to the bispectrum and/or bicoherence to classify and decode the signal. That is, the neural network 318 can process the threshold gated bispectrum or bicoherence to obtain the desired learned output responses. The output of the neural network 318 can be a number of different outputs, such as, but not limited to, a bit error rate, distortion, pattern decoding, jitter measurements, ISI measurements, signal-to-noise ratio, etc. Although a neural network is shown in the figures, examples of the disclosure are not limited to neural networks and neural network may mean any form of machine learning.

Figure 4:
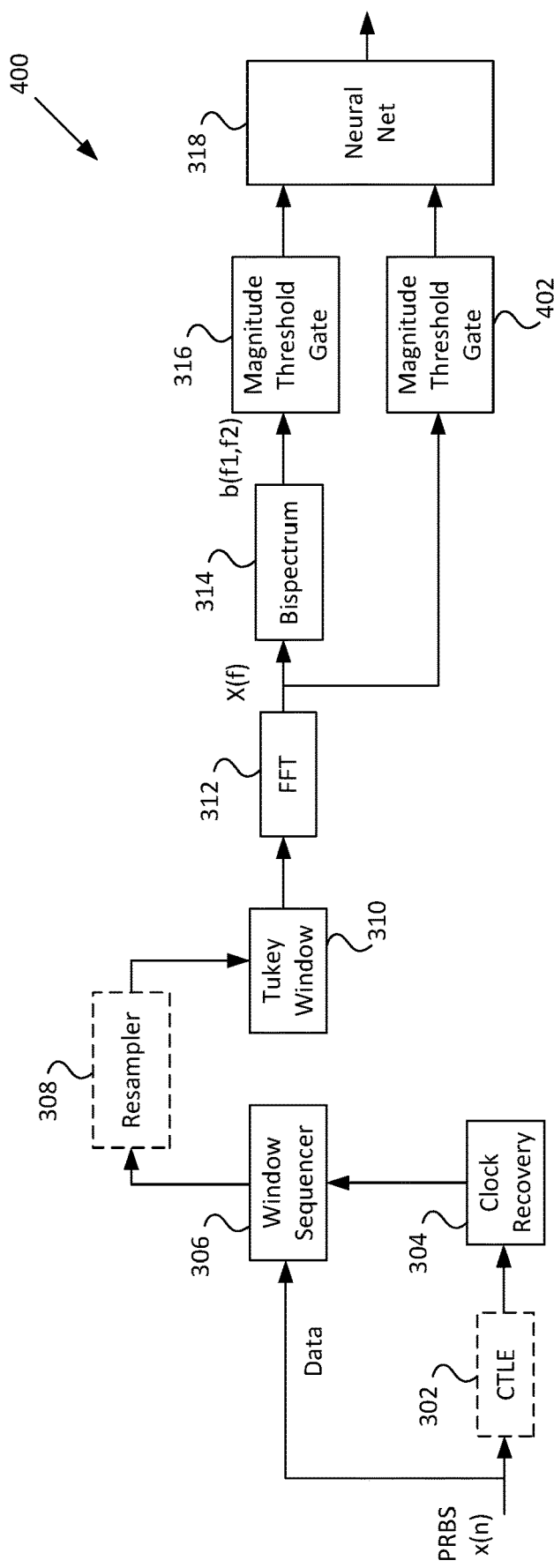
FIG. 4 is a block diagram of another example test and measurement system according to some configurations of the disclosure.

FIG. 4 illustrates another example of a test and measurement instrument 400 according to some examples of the disclosure. In this example, like components to FIG. 3 are given the same reference numbers and not discussed further.

The test and measurement instrument 400 of FIG. 4 is similar to the test and measurement instrument 300 in FIG. 3, but a second threshold gate 402 is provided. The threshold of the second threshold gate 402 may be set by either the user or the one or more processors of the test and measurement instrument 400. The second threshold gate 402 receives an output from the FFT 312 and only outputs the data to the neural network 318 that does not violate the threshold set. The neural network 318 may then use both the output of the FFT and the output of the high-order spectrum data 314 to classify the signal. The second threshold gate 402 can be one of magnitude, phase, or complex threshold gate and may be identical in type to the first threshold gate 316.

Figure 5:
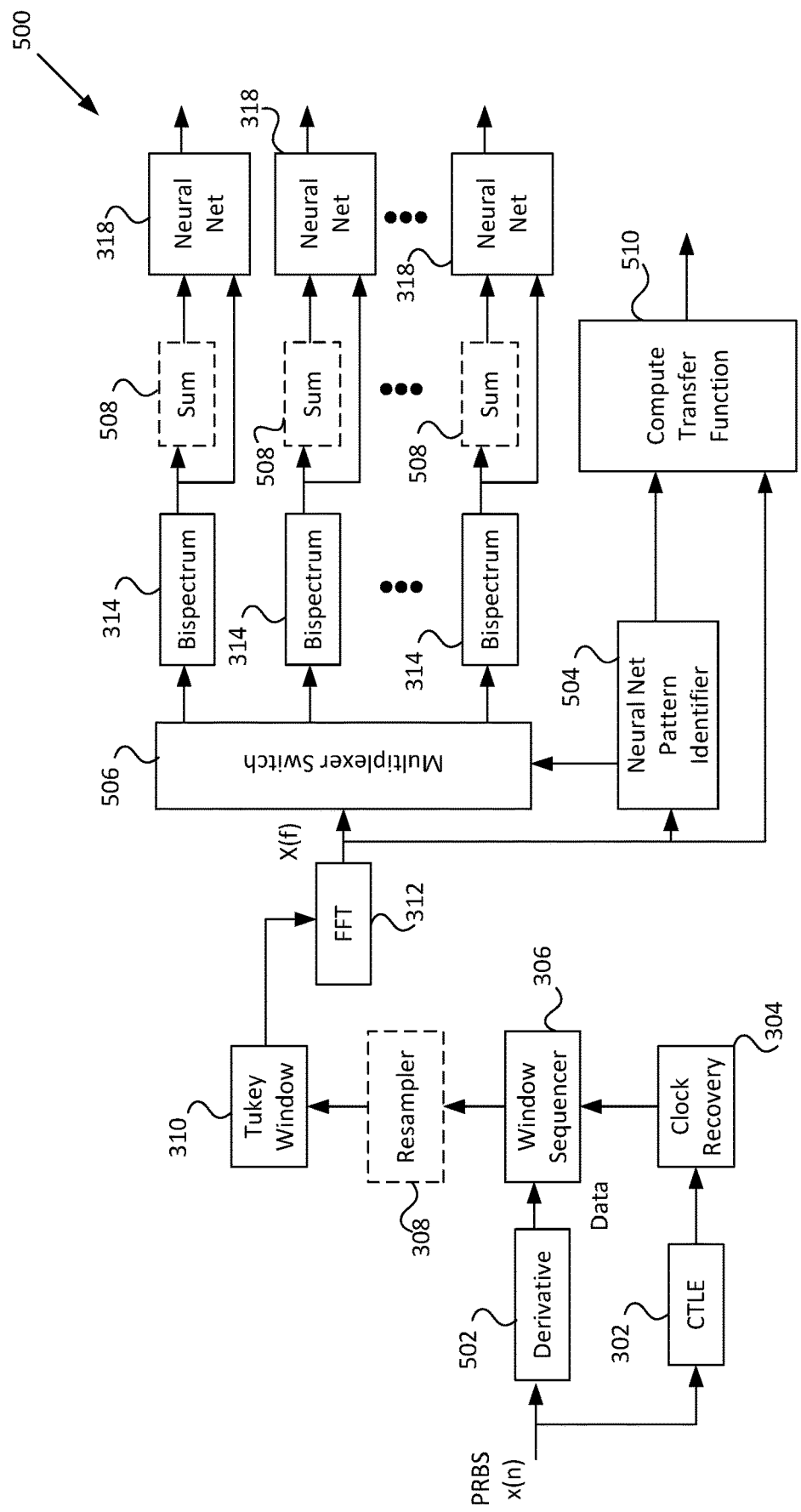
FIG. 5 is a block diagram of another example test and measurement system according to some configurations of the disclosure.

FIG. 5 illustrates yet another example of a test and measurement system 500. Like components to FIG. 3 and FIG. 4 are given the same reference numbers and are not discussed further herein. Including the FFT 312 and the high-order spectrum data 314 incorporates both the second order and the third order statistics, respectively. Some examples may also include the possibility of adding even higher order statistics to use separately or in combination with any of the lower order statistics.

In some alternative examples, high-order spectrum data 314 windows on the signal may be processed by separating out the summation of spectrums to those of like patterns in each FFT 312 window that is referenced to the recovered clock. Then, bispectrum windows of like patterns are summed. For example, if there are 5 symbol intervals in one FFT window, that would allow for 32 patterns and 32 different bicoherence results spectrums. The test and measurement instrument 500 provides a number of different neural networks 318, as discussed in more detail below.

In the test and measurement system 500, the input signal x(n) is received at both the CTLE 302 and a derivative function 502, which can provide the derivative of the input signal x(n) and is performed by the one or more processors of the test and measurement instrument 500. The output of the derivative 502 is also sent to the window sequencer 306.

As mentioned above, if an assumption is made there are five UIs inside the FFT windows, then there would be 32 possible bit patterns. The test and measurement instrument 500 includes a neural network pattern identifier 504. The neural network pattern identifier 504 receives the output of the FFT 312 and classifies the pattern of the FFT window. The neural network pattern identifier 504 can identify the pattern of several bits within the window even in the presence of some noise and ISI.

The output pattern from the neural network pattern identifier 504 is sent to a multiplexer switch 506. The multiplexer switch 506 can select one of a different number of paths to which to send the output of the FFT 312. In the example above, there are 32 different patterns, so 32 different paths would be provided in such an example. The number of paths provided or used can correspond to the number of potential patterns.

In each path, the high-order spectrum data 314 is determined, as discussed above. The output of the high-order spectrum data 314 is sent to a neural network 318 to be classified. In some examples, optional sum or averaging blocks 508 may be provided in the path. The high-order spectrum data 314 tends to reduce noise towards zero and keeps the coherent parts of the spectrum. Jitter, however, will cause variations of these phases from one pattern to the next. The sum blocks 508 average the output of each high-order spectrum data 314 containing the same bit pattern as the previous one. This would tend to average out the jitter showing up in the bicoherence result. The neural network 318 can compare the averaged bicoherence with an instantaneous bicoherence output to provide a measure of jitter.

Although not shown in FIG. 5, each individual path may also include a threshold gate 316 in some examples. The threshold gate may include any of an average threshold and/or a magnitude, phase, or complex threshold for each instantaneous bicoherence output.

Additionally, an output of the neural net pattern identifier 504 may be sent to a transfer function block 510, which uses one or more processors to determine a transfer function. An output of the FFT 312 is also sent to the transfer function block 510. The transfer function block 510 can determine the transfer function of the transmitter and serial data channel. One method for doing this may be to divide the spectrum of the ideal pattern waveform by the spectrum of the acquired waveform, and then perform an inverse FFT (IFFT) to obtain the impulse response. Other known methods may be used as well.

Figure 6:
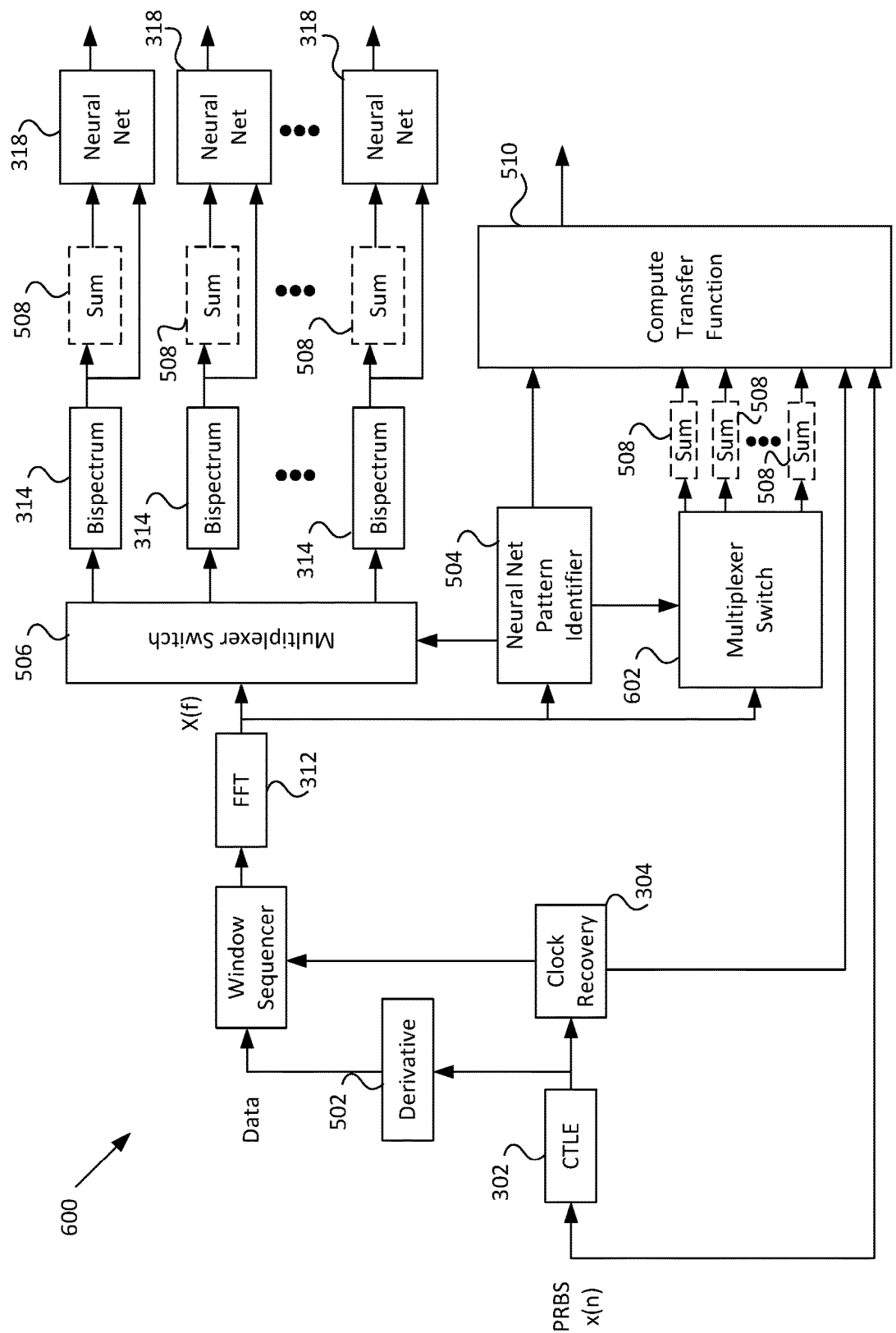
FIG. 6 is a block diagram of another example test and measurement system according to some configurations of the disclosure.

FIG. 6 illustrates another example of a test and measurement system 600. Like components to FIGS. 3-5 are given the same reference numbers and are not discussed further herein. The test and measurement system 600 can include a second multiplexer switch 602, which has a number of output paths. The output paths correspond to the number of patterns.

When a pattern is identified through the neural network pattern identifier 504, the multiplexer switch 602 determines which path to receive the output from the FFT 312. Each path may also include an optional sum block 508 to average the FFT 312 of each window of like pattern. The transfer function block 510 can include an output from each sum block 508, as well as the recovered clock signal from the clock recovery 304 and the original input signal x(n) to compute the transfer function.

How to compute the short term FFT 312 of each segment of the input signal x(n) at different windowed time positions along the time record will now be described. The first point of the FFT window is the time position representing zero phase. To maintain a constant phase reference for the bicoherence computation, bit patterns in each FFT window gated region should be identified and sorted. Thus, only the same sequence of bit patterns will be summed together for the averaging of the bispectrum output. The averaged bispectrum is then normalized to obtain bicoherence as described above in equation (8).

The width of the FFT 312 window is an integer number of bits in the input signal x(n) which is being analyzed. The zero-phase reference point of the FFT 312 is at the start time of the window. As shown in FIG. 2, discussed above, the spectrum of the derivative of an ideal step at each bit transition is constant amplitude at all frequencies from direct current or zero to its Nyquist frequency. The phases of all ideal impulses in the FFT 312 windows are zero at all frequencies with a phase reference point at the time position of the impulse. However, the zero-phase reference point of each FFT 312 will be at the start of the FFT 312, such that the full band of frequencies representative of each edge are different from the phase of the other edges within the FFT 312 window.

The FFT result will have a single set of frequencies and phases that are obtained from the sum of the frequencies from all the edges. It would be expected that each combination of bit patterns within the window interval would have unique set of phases and magnitudes in the spectrum which can be used in the neural network 318 to decode the bit sequence within the window for the purpose of sorting each pattern into a different high-order spectrum data 314 path for summing them up.

Figure 7:
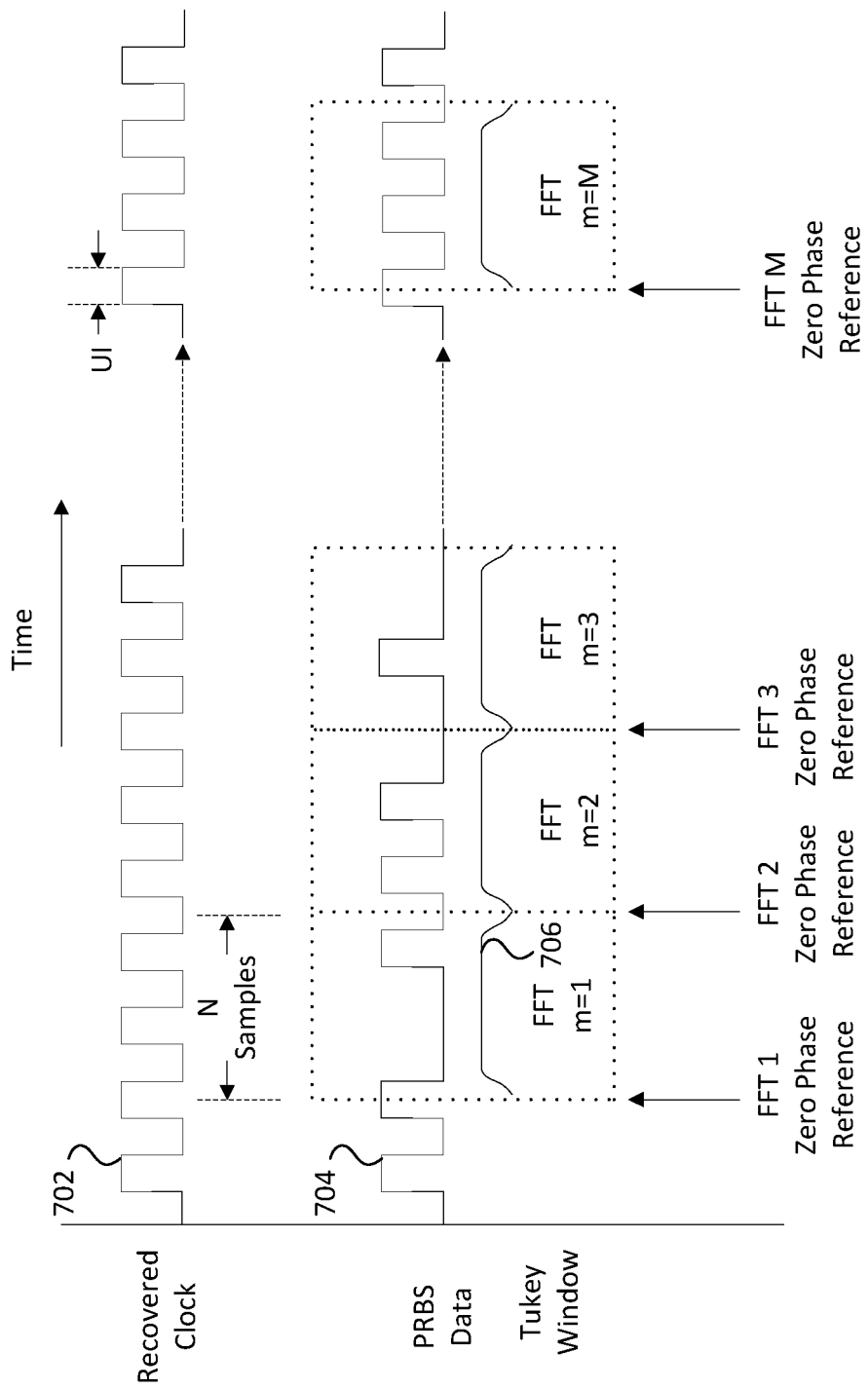
FIG. 7 is a timing diagram illustrating a recovered clock signal and the windowing function of the input signal.

FIG. 7 illustrates a relationship between the recovered clock 702, the input signal x(n) 704, and a Tukey window function 706. In the illustration of FIG. 7, the input signal x(n) 704 is a PRBS data signal. As illustrated in FIG. 7, a unit interval (UI) is a width of one pulse of the recovered clock.

As seen in FIG. 7, the Tukey window 706 length is N sample bits and begins and ends in the center of a clock cycle. The zero phase reference for each FFT is set at the beginning of each window. The FFT window is relatively short compared to the number of samples and UIs that are allowed to have a reasonable size for the bispectrum for neural network 318 analysis.

The window is an integer number of UIs with the start of each FFT in the center of a UI, as illustrated in FIG. 7. One way to address windowing of the FFT 312 and transients at the end of the circular window can be to compute the derivative of the data, as illustrated in some of the figures discussed above, and then center the start of the FFT window in the middle of the UI where the derivative is zero. Setting the center of the start of the FFT window in the middle of the UI where the derivative is zero can avoid transient leakage at the beginning and end of the record.

In addition, a Tukey window can be applied to taper the ends of the FFT record to zero. This can be done to reduce the effects of ISI from the previous window being different for the same patterns in a window that are sorted to a specific bispectrum path. Each path having one of the possible 32-bit patterns when using five bits for the window intervals.

Taking the derivative may not be preferred in some examples as it can boost high frequency noise. However, the bicoherence path can take the sorted bit patterns and compute bicoherence which tends to remove the noise. In addition, the pattern paths may be averaged, as shown in the figures, to remove additional noise and jitter variations from one similar bit pattern to the next.

Resampler block 308 can remove sample clock jitter with respect to the zero phase reference point of the FFT window. This ensures that a time-domain sample of the waveform always occurs exactly at the same time as the zero phase reference.

Examples of this disclosure are not limited to window intervals of five bits, as discussed above, but may be smaller or larger depending on a sample rate of the test and measurement instrument. Edges in the window may jitter due to signal clock jitter or may delay random amounts such that their combination in that one window instance may be similar to the average obtained from the sum block 508. The best observation for jitter may be obtained by making a smaller FFT window and including less UIs with less edges. One edge per window would be ideal, but sample rates may not be high enough to optimally support such a configuration.

Different components are shown in different arrangements in each of the test and measurement instruments illustrated in FIGS. 3-7. As will be understood by one skilled in the art, the components may be arranged in alternative matters, such as threshold gates may or may not be provided for each bicoherence output, the derivative may or may not be performed, a resampler may be present in some examples and not in others, bispectrum may be used instead of bicoherence, higher order statistics may be incorporated, machine learning algorithms rather than neural networks may be used, etc.

As will readily be understood by one skilled in the art, each of the test and measurement instruments discussed above may include additional components not shown in the examples. For example, each of the test and measurement instruments may include one or more processors, additional hardware or firmware, one or more memory components, a user interface, a display, etc.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument for analyzing signals, comprising an input configured to receive a signal; a digital-to-analog converter configured to convert the signal into a digital signal; and one or more processors configured to: determine a recovered clock signal based on the digital signal, set window positions for a fast Fourier transform of the digital signal, isolate the digital signal into a series of windowed waveform data based on the window positions, transform each of the windowed waveform data into a frequency-domain windowed waveform data using a fast Fourier transform, and determine high-order spectrum data of each of the frequency-domain windowed waveform data; and a neural network configured to receive the high-order spectrum data of the frequency-domain windowed transform data and classify each windowed waveform data based on the high-order spectrum data.

Example 2 is the test and measurement instrument of example 1, further comprising a threshold gate configured to receive the high-order spectrum data and pass the high-order spectrum data that do not violate the threshold and set the high-order spectrum data that violate the threshold to a nominal value.

Example 3 is the test and measurement instrument of example 2, wherein the nominal value is zero.

Example 4 is the test and measurement instrument of any one of examples 1-3, wherein the high-order spectrum data includes at least one of a magnitude value, a phase value, or complex value.

Example 5 is the test and measurement instrument of any one of examples 1-4, further comprising a multiplexing switch configured to receive the frequency-domain windowed waveform data and route it to particular path based on a received bit pattern, wherein the one or more processors include determining the high-order spectrum data of each of the frequency-domain windowed waveform data for each path and a respective neural network is provided for each path for classifying each windowed waveform data based on the high-order spectrum data of the respective path; and a bit pattern recognition neural network configured to receive the frequency-domain windowed waveform data and output the bit pattern.

Example 6 is the test and measurement instrument of example 5, wherein the one or more processors are further configured to average the high-order spectrum data of each of the frequency-domain windowed waveform data and each respective neural network is configured to classify the windowed waveform data based on the average of the high-order spectrum data.

Example 7 is the test and measurement instrument of either one of examples 5 or 6, wherein the one or more processors are further configured to determine a transfer function of a channel of the test and measurement instrument based on the output bit pattern of the bit pattern recognition neural network.

Example 8 is the test and measurement instrument of any one of examples 1-7, wherein the neural network is configured to output at least one of a bit error rate, distortion, pattern decoding, a jitter measurement, signal-to-noise ratio, and inter-symbol interference based on classifying the windowed waveform data.

Example 9 is the test and measurement instrument of any one of examples 1-8, wherein the one or more processors are configured to isolate the digital signal into a series of windowed waveform data based on the window positions using a Tukey window function.

Example 10 is a method for analyzing an input signal in a test and measurement system, comprising receiving an input signal; determining a recovered clock signal based on the input signal; setting window positions for fast Fourier transforms of the digital signal; isolating the input signal into a series of windowed waveform data based on the window positions; transforming each of the windowed waveform data into a frequency-domain windowed waveform data using a fast Fourier transform; determining high-order spectrum data of each of the frequency-domain windowed waveform data; and classifying by a neural network each windowed waveform data based on the high-order spectrum data.

Example 11 is the method of example 10, further comprising passing high-order spectrum data that do not violate a threshold to the neural network and setting the high-order spectrum data that violate the threshold to a nominal value.

Example 12 is the method of either one of examples 10 or 11, wherein the high-order spectrum data includes at least one of a magnitude value, a phase value, or a complex value.

Example 13 is the method of any one of examples 10-12, further comprising detecting a bit pattern based on the frequency-domain windowed waveform data by a bit pattern recognition neural network; and routing the frequency-domain windowed waveform data to a particular neutral network based on the bit pattern to classify the high-order spectrum data of each of the frequency-domain windowed waveform data based on the bit pattern.

Example 14 is the method of example 13, further comprising averaging the high-order spectrum data of each of the frequency-domain windowed waveform data for a particular bit pattern prior to classifying the high-order spectrum data of each of the frequency-domain windowed waveform data based on the bit pattern.

Example 15 is the method of any one of examples 10-14, wherein classifying each windowed waveform data includes outputting at least one of a bit error rate, distortion, pattern decoding, a jitter measurement, signal-to-noise ratio, and inter-symbol interference based on classifying the windowed waveform data.

Example 16 is the method of any one of examples 10-15, wherein isolating the digital signal into a series of windowed waveform data based on the window positions using a Tukey window function.

Example 17 is one or more non-transitory computer-readable storage media comprising instructions, which, when executed by one or more processors of a test and measurement instrument, cause the test and measurement instrument to determine a recovered clock signal based on an input signal; set window positions for fast Fourier transforms of the digital signal; isolate the input signal into a series of windowed waveform data based on the window positions; transform each of the windowed waveform data into a frequency-domain windowed waveform data using a fast Fourier transform; determine high-order spectrum data of each of the frequency-domain windowed waveform data; and classify by a neural network each windowed waveform data based on the high-order spectrum data.

Example 18 is the one or more non-transitory computer-readably storage media of example 17, further comprising instructions that cause the test and measurement to pass high-order spectrum data that do not violate a threshold to the neural network and set the high-order spectrum data that violate the threshold to a nominal value.

Example 19 is the one or more non-transitory computer-readably storage media of either one of examples 17 or 18, further comprising instructions that cause the test and measurement to detect a bit pattern based on the frequency-domain windowed waveform data by a bit pattern recognition neural network; and route the frequency-domain windowed waveform data to a particular neutral network based on the bit pattern to classify the high-order spectrum data of each of the frequency-domain windowed waveform data based on the bit pattern.

Example 20 is the one or more non-transitory computer-readably storage media of example 19, further comprising instructions that cause the test and measurement to average the high-order spectrum data of each of the frequency-domain windowed waveform data for a particular bit pattern prior to classifying the high-order spectrum data of each of the frequency-domain windowed waveform data based on the bit pattern.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument for analyzing signals, comprising:
   an input configured to receive a signal;
   a analog to-digital converter configured to convert the signal into a digital signal; and
   one or more processors configured to:
     determine a recovered clock signal based on the digital signal,
     set window positions for a fast Fourier transform of the digital signal,
     isolate the digital signal into a series of windowed waveform data based on the window positions,
     transform each of the windowed waveform data into a frequency-domain windowed waveform data using a fast Fourier transform, and
     determine high-order spectrum data of each of the frequency-domain windowed waveform data;
   a bit pattern recognition neural network configured to receive the frequency-domain windowed waveform data and output a bit pattern; and
   a multiplexing switch configured to receive the frequency-domain windowed waveform data and route it to particular path based on the bit pattern, wherein the one or more processors include determining the high-order spectrum data of each of the frequency-domain windowed waveform data for each path; and
   a neural network configured to provide a respective neural network for each path for classifying each windowed waveform data based on the high-order spectrum data of the respective path.

2. The test and measurement instrument of claim 1, further comprising a threshold gate configured to receive the high-order spectrum data and pass the high-order spectrum data that do not violate the threshold and set the high-order spectrum data that violate the threshold to a nominal value.

3. The test and measurement instrument of claim 2, wherein the nominal value is zero.

4. The test and measurement instrument of claim 1, wherein the high-order spectrum data includes at least one of a magnitude value, a phase value, or complex value.

5. The test and measurement instrument of claim 1, wherein the one or more processors are further configured to average the high-order spectrum data of each of the frequency-domain windowed waveform data and each respective neural network is configured to classify each windowed waveform data based on the average of the high-order spectrum data.

6. The test and measurement instrument of claim 1, wherein the one or more processors are further configured to determine a transfer function of a channel of the test and measurement instrument based on the output bit pattern of the bit pattern recognition neural network.

7. The test and measurement instrument of claim 1, wherein the neural network is configured to output at least one of a bit error rate, distortion, pattern decoding, a jitter measurement, signal-to-noise ratio, and inter-symbol interference based on classifying the windowed waveform data.

8. The test and measurement instrument of claim 1, wherein the one or more processors are configured to isolate the digital signal into a series of windowed waveform data based on the window positions using a Tukey window function.

9. A method for analyzing an input signal in a test and measurement system, comprising:
   receiving an input signal;
   determining a recovered clock signal based on the input signal;
   setting window positions for fast Fourier transforms of the digital signal;
   isolating the input signal into a series of windowed waveform data based on the window positions;
   transforming each of the windowed waveform data into a frequency-domain windowed waveform data using a fast Fourier transform;
   determining high-order spectrum data of each of the frequency-domain windowed waveform data;
   detecting a bit pattern based on the frequency-domain windowed waveform data by a bit pattern recognition neural network;
   routing the frequency-domain windowed waveform data to a particular neutral network based on the bit pattern; and
   classifying the high-order spectrum data of each of the frequency-domain windowed waveform data.

10. The method of claim 9, further comprising passing high-order spectrum data that do not violate a threshold to the neural network and setting the high-order spectrum data that violate the threshold to a nominal value.

11. The method of claim 9, wherein the high-order spectrum data includes at least one of a magnitude value, a phase value, or a complex value.

12. The method of claim 9, further comprising averaging the high-order spectrum data of each of the frequency-domain windowed waveform data for a particular bit pattern prior to classifying the high-order spectrum data of each of the frequency-domain windowed waveform data based on the bit pattern.

13. The method of claim 9, wherein classifying each windowed waveform data includes outputting at least one of a bit error rate, distortion, pattern decoding, a jitter measurement, signal-to-noise ratio, and inter-symbol interference based on classifying each windowed waveform.

14. The method of claim 9, wherein isolating the digital signal into a series of windowed waveform data based on the window positions includes using a Tukey window function.

15. One or more non-transitory computer-readable storage media comprising instructions, which, when executed by one or more processors of a test and measurement instrument, cause the test and measurement instrument to:
   determine a recovered clock signal based on an input signal;
   set window positions for fast Fourier transforms of the digital signal;
   isolate the input signal into a series of windowed waveform data based on the window positions;
   transform each of the windowed waveform data into a frequency-domain windowed waveform data using a fast Fourier transform;
   determine high-order spectrum data of each of the frequency-domain windowed waveform data;
   detect a bit pattern based on the frequency-domain windowed waveform data by a bit pattern recognition neural network;
   route the frequency-domain windowed waveform data to a particular neutral network based on the bit pattern; and
   classify the high-order spectrum data of each of the frequency-domain windowed waveform data.

16. The one or more non-transitory computer-readably storage media of claim 15, further comprising instructions that cause the test and measurement to pass high-order spectrum data that do not violate a threshold to the neural network and set the high-order spectrum data that violate the threshold to a nominal value.

17. The one or more non-transitory computer-readably storage media of claim 15, further comprising instructions that cause the test and measurement to average the high-order spectrum data of each of the frequency-domain windowed waveform data for a particular bit pattern prior to classifying the high-order spectrum data of each of the frequency-domain windowed waveform data based on the bit pattern.

* * * * *